United States Patent [19]

Konomi et al.

[11] Patent Number: 4,604,544
[45] Date of Patent: Aug. 5, 1986

[54] PIEZOELECTRIC PRESSURE INDICATOR

[75] Inventors: Toshiaki Konomi, Susono; Koji Ito, Gotenba; Yukihiro Nagahori, Kitaadachi; Akio Ito, Kounosu, all of Japan

[73] Assignees: Jeco Co., Ltd., Kanagawa; Toyota Jidosha Kabushiki Kaisha, Aichi, both of Japan

[21] Appl. No.: 661,542

[22] Filed: Oct. 16, 1984

[30] Foreign Application Priority Data

Oct. 17, 1983 [JP] Japan .................. 58-193904
Oct. 17, 1983 [JP] Japan .............. 58-160487[U]
Oct. 17, 1983 [JP] Japan .............. 58-160488[U]
Oct. 17, 1983 [JP] Japan .............. 58-160489[U]

[51] Int. Cl.$^4$ ............................................ H01L 41/08
[52] U.S. Cl. ................................................ 310/338
[58] Field of Search .............. 310/328, 338, 339; 73/763, 818, 820, 862.38, 862.68, 700, 715, 717, 718, 725, 726, 744, 745, 753, 754, DIG. 4

[56] References Cited

U.S. PATENT DOCUMENTS

| | | | |
|---|---|---|---|
| 3,281,612 | 10/1966 | Hatschek | 310/338 |
| 3,349,259 | 10/1967 | Kistler | 310/338 |
| 3,495,102 | 2/1970 | List et al. | 310/338 |
| 3,602,744 | 6/1969 | Hugli | 310/338 |
| 3,857,287 | 12/1974 | Sonderegger et al. | 310/338 X |
| 4,507,583 | 3/1985 | Jensen et al. | 310/338 |

FOREIGN PATENT DOCUMENTS 236820 10/1969 U.S.S.R. ............... 310/338

Primary Examiner—Mark O. Budd
Attorney, Agent, or Firm—Townsend & Townsend

[57] ABSTRACT

In a piezoelectric pressure indicator comprising a casing, a pressure receiving member at the bottom of the casing, piezoelectric elements mounted on the pressure receiving member, an acceleration compensating weight and acceleration compensating piezoelectric elements, both piezoelectric elements being connected such that the voltage produced thereby cancel with each other, thereby compensating for an effect of acceleration, an uppermost acceleration compensating element is formed with a perforation, and a lead wire for deriving the voltage is connected to the electrode of a lower imperforate acceleration compensating piezoelectric element to extend through the perforation of the imperforated element. In a modification, the pressure receiving member is covered by a heat resistant protective layer made of ceramic.

3 Claims, 12 Drawing Figures

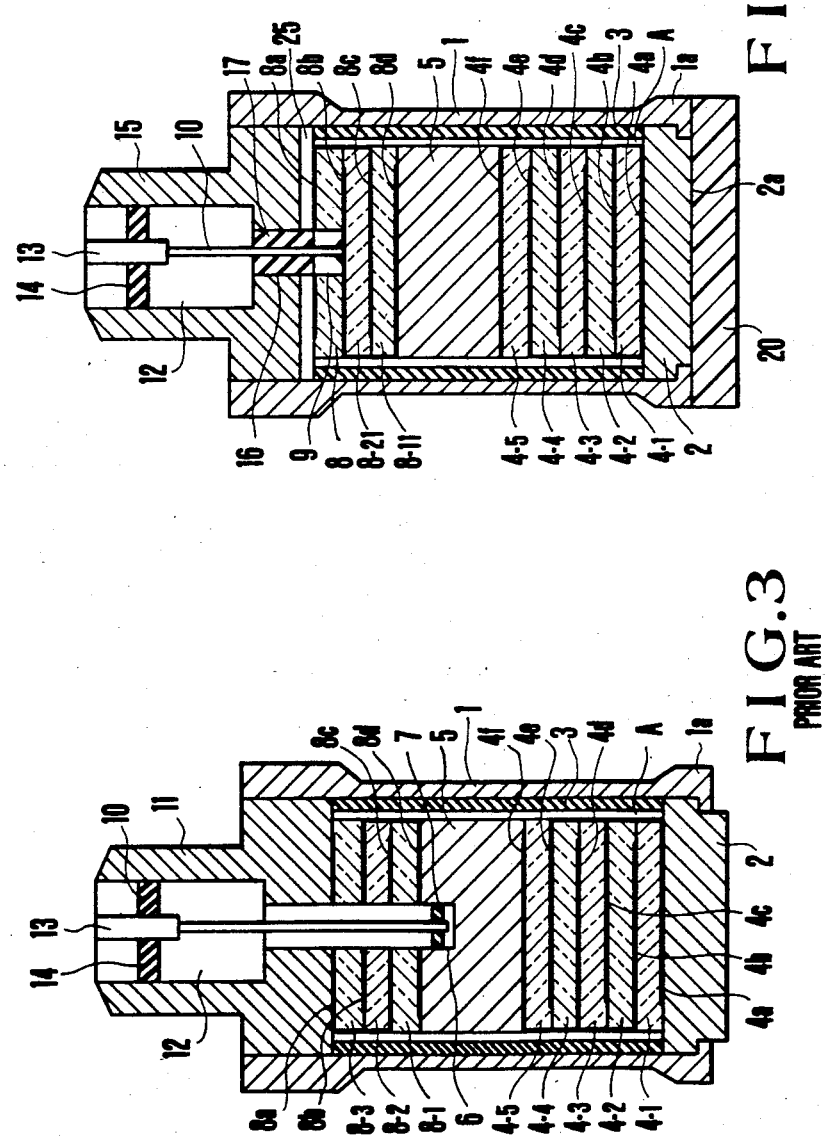

PIEZOELECTRIC PRESSURE INDICATOR

BACKGROUND OF THE INVENTION

This invention relates to an improvement of a piezoelectric type pressure indicator utilized to measure the pressure in a cylinder of an internal combustion engine, that is, the pressure diagram, and more particularly a piezoelectric type pressure indicator wherein an electric voltage of a piezoelectric element generated by inertia due to accleration is corrected for improving the measuring accuracy.

FIG. 1 shows a basic construction of a prior art piezoelectric pressure indicator provided with a conventional acceleration compensation mechanism. The pressure indicator shown in FIG. 1 comprises a cylindrical casing or sleeve 1 made of metal such as stainless steel, and a plate shaped pressure receiving member 2 of the same metal is mounted on the inner periphery of the bottom 1a of the casing 1. A cylindrical insulating member 3 made of Teflon, for example, is inserted in the casing, and three piezoelectric elements 4-1 to 4-3 made of X-cut quartz are laminated on the pressure receiving member 2 inside of the insulating member 3. Electrodes 4a to 4d are applied to the piezoelectric elements 4-1 to 4-3 and interconnected such that the electromotive forces or voltages generated therein when they are pressed in the direction of X add each other. Between the insulating member 3 and the piezoelectric elements 4-1 to 4-3 is formed a gap A for improving the measuring accuracy. A weight 5 (also called a mass) made of tungsten and adapted to compensate for acceleration and also acting as an electrode memeber is mounted on the electrode 4d of the laminated piezoelectric elements 4-1 to 4-3. A connecting piece 7 with a lead wire 10 is disposed in a recess 6 at the center of the upper surface of the weight 5. An acceleration compensating piezoelectric element 8 made of an X- cut quartz crystal and having a perforation 9 through which the lead wire 10 passes is mounted on the weight 5. A bushing 11 made of stainless steel is inserted into an upper end of the casing 1 to overlie the piezoelectric element 8 so as to derive out an electric signal corresponding to the pressure applied to the pressure receiving member 2 through lead wire 10. The lead wire 10 is connected to a terminal 13 within a central opening 12 of the bushing member 11 serving as an output voltage deriving means. The terminal 13 is supported by a sealing member 14 which hermetically seals the central opening 12. The piezoelectric element 8 is provided with electrodes 8a and 8b on both surfaces thereof.

The operation of the piezoelectric pressure indicator described above will be described with reference to a model shown in FIG. 2 in which mM represents the mass of a vibratory portion acting as the pressure receiving member 2 subjected to pressure P to be measured, mD represents the mass of a pressure transmitting member, ms represents the mass of the acceleration compensating weight 5, and the electrodes 4a, 4c and 8a of the piezoelectric elements 4-1, 4-2, 4-3 and 8 are connected in parallel to ground. Other electrodes 4b, 4d and 8b are also connected in parallel to the lead wire 10. Symbols (+) and (−) show the polarities of the electromotive forces appearing at the electrodes 4a to 4d, 8a and 8b when a pressure is applied in the direction of X axis. Denoting the piezoelectric constant of the piezoelectric elements 4-1 to 4-3 and 8 by $d_{11}$ and the acceleration applied to the pressure indicator by $\alpha$, the electromotive force caused by the acceleration $\alpha$, that is, voltage Q appearing at the electrodes 4b and 4d of the piezoelectric element is expressed by the following equation.

$$Q = 3d_{11}F \qquad (1)$$
$$= 3d_{11}(mM + mD)\alpha.$$

where F represents the inertia exerted on the piezoelectric elements 4-1 to 4-3 due to the acceleration $\alpha$. Denoting the inertia exerted on the piezoelectric element 8 due to the acceleration $\alpha$ by $F^*$, the electromotive force $Q^*$ generated at the electrode 8b of the piezoelectric element 8 owing to the mass mS of the acceleration compensating weight 5 is expressed by the following equation.

$$Q^* = -d_{11}F^* \qquad (2)$$
$$= -D_{11}(mM + mD + mS)\alpha.$$

However, in order to compensate for the electromotive $\alpha$ force generated by the inertia due to the acceleration $\alpha$, it is necessary to satisfy the following equation $$Q + Q^* = 0 \qquad (3).$$

Then the electromotive force caused in response to the acceleration $\alpha$ would be cancelled, thereby correcting the effect of acceleration. More particularly, equations (1) and (2) are put into equation (3) to obtain an equation, $$Q + Q^* = 3d_{11}(mM + mD)\alpha - d_{11}(mM + mD + mS)\alpha = 0. \qquad (4)$$

From equation (4), we can obtain the following equation $$mS = 2(mM + mD) \qquad (5).$$

As described above, by compensating for the electromotive force generated in response to the inertia due to the acceleration applied to the pressure indicator, pressure can be measured with high accuracies.

In the prior art pressure indicator described above, since the lead wire 10 is connected to the inside of the acceleration compensating weight 5, the connection of the lead wire can be made rigid and reliable. However, since only one acceleration compensating quartz piezoelectric element 8 having a perforation 9 is used, it is impossible to obtain sufficient compensation. For this reason, it has been proposed to use three perforated acceleration compensating piezoelectric elements 8-1 to 8-3 which are laminated as shown in FIG. 3 in which elements corresponding to those shown in FIG. 1 are designated by the same reference numerals. In FIG. 3, five piezoelectric elements 4-1 to 4-5 are laminated on the pressure receiving member 2 and these piezoelectric elements 4-1 to 4-5 are interconnected with the perforated piezoelectric elements 8-1 to 8-3 to cancel the electromotive force caused by acceleration. With this construction, however, since three perforated acceleration compensating piezoelectric elements 8-1 to 8-3 are used each having a manufacturing cost which is about 10 times that of the imperforate piezoelectric element, the cost of the pressure indicator increases. Moreover, since the lead wire 10 is connected to the acceleration compensating weight 5, the connection of the lead wire becomes difficult depending upon the position of the weight 5.

The piezoelectric pressure indicator of the type described above is mounted such that its pressure receiving member projects to a point near the wall surface of the engine combustion chamber. Therefore, the pressure receiving member is usually made of heat and corrosion resistant metal. However, in a high temperature corrosive atmosphere, corrosion and degradation of the pressure receiving member is unavoidable. To eliminate this problem, that is, for the purpose of protecting the pressure receiving member, it has been tried to mount the pressure receiving member through a metal rod. With this method of mounting, however, sufficient heat resistant property can not be provided and hysteresis is caused by the elasticity of the metal rod.

In the piezoelectric pressure indicator utilizing a plurality of piezoelectic elements, since the voltage produced by each element is very small, for the purpose of preventing leakage of the voltage and degradation of the elements, it is usual to sufficiently remove moisture remaining in the casing 1 by drying or to assemble the pressure indicator in an environment containing very small quantities of moisture. However, as the uppermost piezoelectric element 8 and the bushing member 11 inserted in the upper portion of the casing contact directly, the internal air is difficult to discharge and it takes a long time for drying.

SUMMARY OF THE INVENTION

Accordingly, it is a main object of this invention to improve the piezoelectric pressure indicator.

Another object of this invention is to provide an inexpensive piezoelectric pressure indicator having a high measurement accuracy.

Another object of the invetion is to provide a piezoelectric pressure indicator which can be used in a high temperature corrosive atmosphere.

Still another object of this invention is to provide a piezoelectric pressure indicator capable of being dried in a short time.

A further object of this invention is to provide an improved output voltage deriving means of the piezoelectric pressure indicator.

Broadly, according to this invention, there is provided a piezoelectric pressure indicator comprising a casing, a pressure receiving member at the bottom of the casing, piezoelectric element means mounted on the pressure receiving member for producing an electric voltage corresponding to a pressure applied to the pressure receiving member, an acceleration compensating weight and acceleration compensating piezoelectric element means, the first mentioned piezoelectric element means and the acceleration compensating piezoelectric element means being electrically connected such that voltages produced by the piezoelectric element means cancel with each other, thereby compensating for an effect of acceleration, wherein the acceleration compensating piezoelectric element means comprises an uppermost perforated element and an imperforate element there under, and a lead wire for deriving the electric voltage is connected to an electrode of the imperforate element to extend through a perforation of the perforated element.

BRIEF DESCRIPTION OF THE DRAWINGS

In the accompanying drawings:

FIG. 3 is a sectional view showing another prior art piezoelectric pressure indicator;

FIG. 4 is a sectional view showing one embodiment of a piezoelectric pressure indicator according to this invention;

DESCRIPTION OF THE PREFERRED EMBODIMENTS

Figure 1:
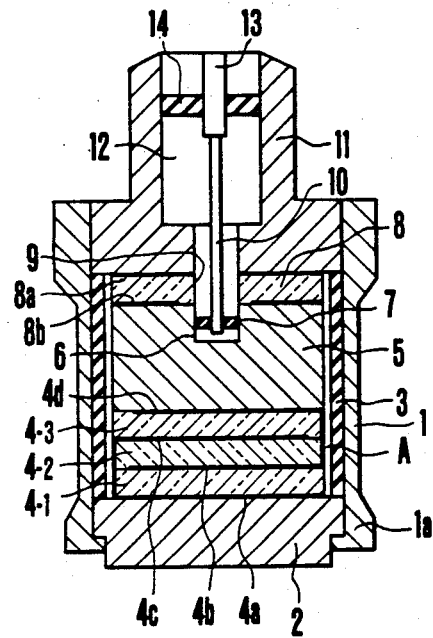
FIG. 1 is a sectional view showing the construction of a prior art piezoelectric pressure indicator.
Figure 2:
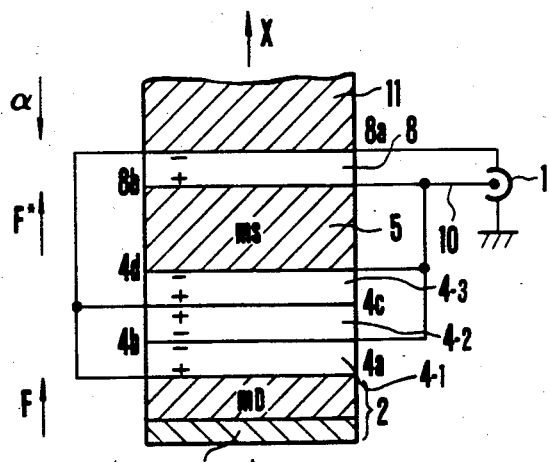
FIG. 2 shows a model useful to explain the operation of the pressure indicator shown in FIG. 1.

FIG. 4 shows a preferred embodiment of this invention in which elements corresponding to those shown in FIGS. 1 and 3 are designated by the same reference numerals. In this embodiment, usual piezoelectric elements 4-1 to 4-5 and a cylindrical acceleration compensating weight 5 are laminated just in the same manner as in FIG. 3, but imperforate piezoelectric elements 8-11 and 8-21 as well as a perforated piezoelectric element 8 having a perforation 9 are laminated on the, upper surface of the weight 5, for compensating for the acceleration effect. At the center of one electrode surface $8b$ of the imperforate piezoelectric element 8-21 is directly connected one end of a lead wire 10. The lead wire 10 is led to a terminal 13 for external connection through perforation 9 of the perforated piezoelectric element 8, and an opening 16 of a bushing member 15 standing for an output voltage deriving means disposed in the casing 1 and mounted on an electrode surface $8a$ of the piezoelectric element 8. An insulator 17 made of fluorine resin or ceramic is embedded in the opening 16 of the bushing 15, for reinforcing the lead wire 10 and for insulating the bushing 15.

Respective piezoelectric elements 4-1 to 4-5 and acceleration compensating piezoelectric elements 8-11, 8-21 and 8 are interconnected by electrodes $4a$ to $4f$ and $8a$ to $8d$ so as to mutually cancel the voltages generated by acceleration in the same manner as in the prior art pressure indicator.

As described above, by using a single perforated piezoelectric element 8 at the uppermost layer and two imperforate piezoelectric elements 8-11 and 8-21 beneath the piezoelectric element 8 as the piezoelectric elements for compensating acceleration effect, the number of expensive perforated piezoelectric elements can be reduced to one, thus reducing the cost of the piezoelectric pressure indicator. Moreover, since the lead wire 10 is led out of the electrode $8b$ of the imperforate piezoelectric element 8-21, there is no limit for the position of the acceleration compensating weight 5, thereby increasing the degree of freedom of wiring.

Although in the foregoing embodiment, three laminated acceleration compensating piezoelectric elements are used, the invention is not limited to this construction. For example, as shown in FIG. 5, one imperforate piezoelectric element 8-11 and one perforated piezoelectric element 8 may be laminated, or any number of imperforate piezoelectric elements may be laminated beneath the uppermost perforated piezoelectric element, for compensating for the acceleration effect.

According to these embodiments, since, for the purpose of compensating for the acceleration effect, a perforated piezoelectric element is disposed as the uppermost layer, an imperforate piezoelectric element is disposed thereunder, and a lead wire is connected directly to the electrode of the imperforate piezoelectric element and led to the outside through the perforation of the perforated piezoelectric element, the number of the perforated piezoelectric elements can be reduced to one and the freedom of wiring can be promoted.

Referring again to FIGS. 4 and 5, the outer surface 2a of the pressure receiving member 2 is protected by a protective layer 20 made of highly heat and corrosion resistant ceramic which is applied by bonding or coating. Since the pressure receiving member 2 is protected by the heat and corrosion resistant layer 20, the heat resistant property of the pressure receiving member against several hundreds degrees centigrade of the prior art can be improved to that against more than 1000 degrees centigrade, and the corrosion resistant property can also be improved. Moreover, since the ceramic protective layer 20 has a lower resiliency than a metal rod, the pressure to be measured can be precisely transmitted to the piezoelectric elements thereby to reduce hysteresis of measurement.

Figure 6:
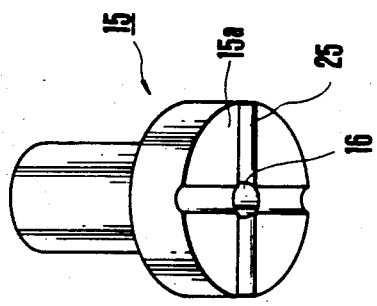
FIG. 6 is a perspective view showing a bushing member (output voltage deriving means) according to this invention.
Figure 5:
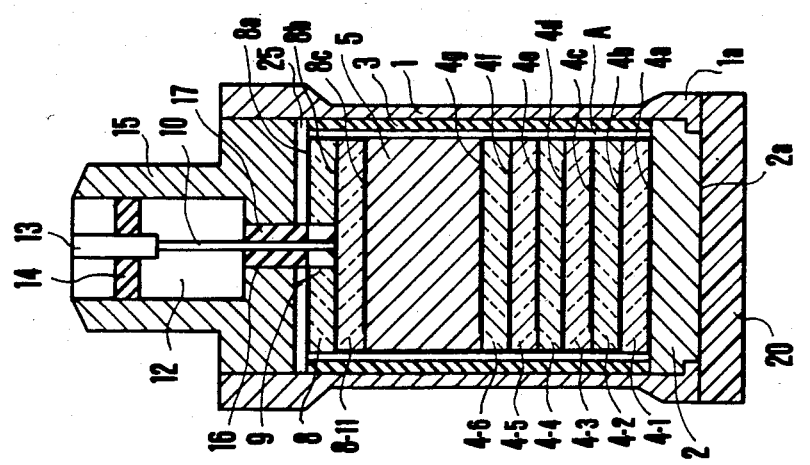
FIG. 5 is a sectional view showing another embodiment of the piezoelectric pressure indicator according to this invention.

In the embodiments of FIGS. 4 and 5, the bushing member 15 standing for the output voltage deriving means has a bottom surface which is not flat but is formed with grooves as shown in FIG. 6. More particularly, a plurality of radial exhaust grooves 25 provided for the bottom surface of the bushing interconnect the central opening 16 and the gap A (see FIGS. 4 and 5) about the piezoelectric elements and the weight. When the assembly is dried by heat, moisture in the casing is readily discharged to the outside through the radial grooves and the central opening. After drying, the bushing is sealed as described previously.

Figure 7:
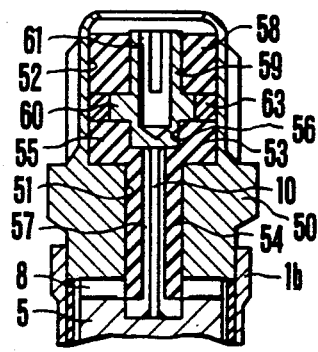
FIG. 7 is fragmentary sectional view showing a prior art output voltage deriving means.

FIG. 7 shows another example of prior art output signal deriving means of the type wherein the shape of the terminal 13 is changed and the tip of the bushing member is calked.

Specifically, a cylindrical bushing 50 made of stainless steel and having a central opening 51 is inserted into an upper end 1b of the casing 1 and seated on the acceleration compensating piezoelectric element 8. The bushing 50 also has an upper cylindrical cavity 52 into which a lower insulating member 53 is inserted. The insulating member 53 has a stem 54 fitted in the central opening 51 and a head 55 fitted in the cavity 52. Formed in the head 55 is a recess 56 which receives a lower stem of a terminal 59. For deriving the voltage generated in the voltage generator (including the piezoelectric elements and weight), terminal 59 is electrically connected to the lead wire 10 connected to the acceleration compensating weight 5 and extending through a central opening 57 in the lower insulating member 53. A sealing member 63 is interposed between a flange 60 of the terminal 59 and the inner wall of the cylindrical cavity 52 of bushing 50. An upper insulating member 58 is fitted about an upper stem 61 of the terminal 59, and the tip of the bushing member 50 is calked so that sealing between the bushing 50 and terminal 59 can be accomplished by the sealing member 63. In this construction, the sealing member 63 must be made of an expensive heat and corrosion resistant material. In additiuon, mounting of the sealing member is troublesome and time-consuming. Degraded electrical insulation property and sealing property of the sealing member lead to deteriorated performance of the pressure indicator.

Figure 8A:
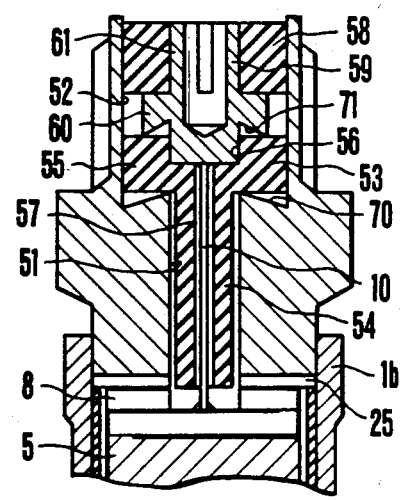
FIG. 8A is a fragmentary sectional view showing an improvement of the output voltage deriving means of the type shown in FIG. 7.
Figure 8B:
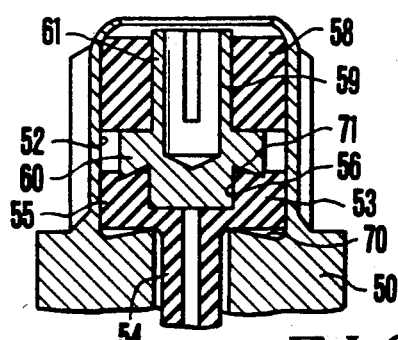
FIG. 8B is a fragmentary sectional view showing the status of the FIG. 8A output voltage deriving means after sealing.

An embodiment of the output voltage deviving means shown in FIGS. 8A and 8B can eliminate the above disadvantages. In FIGS. 8A and 8B, the same elements as those of FIG. 7 are designated by the same reference numerals, and will not be described. In this embodiment, the upper and lower insulating members 58 and 53 for providing electrical insulation between the bushing 50 and terminal 59 are made of fluororesin such as Teflon. As best seen from FIG. 8A, the bushing 50 has a tapered portion 70 through which it engages the bottom surface of the head 55 of the lower insulating member 53 inserted in the cylindrical cavity 52, and the bottom surface of flange 60 of the terminal 59 also has a tapered portion 71 through which the terminal 59 engages the lower insulating member 53. When calking the tip of the bushing 50, the pointed edges of the tapered portions 70 and 71 are pressed against the top and bottom surfaces of the lower insulating member 53, so that the lower insulating member 53 hermetically seals the voltage generator.

Since the lower and upper insulating members 53 and 58 made of Teflon have high resiliency and high electrical insulation property and hence, without resort to the prior art sealing member 63, high electrical insulation can be obtained at low cost and with reduced labor.

Figure 9:
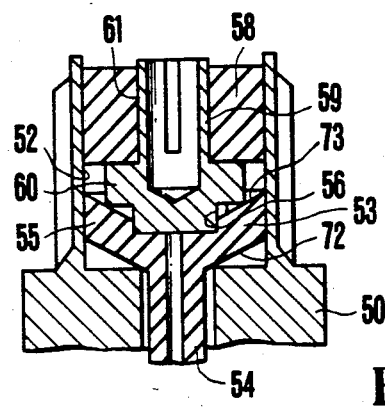
FIGS. 9 to 11 are partial sectional views showing modifications of the FIG. 8A means.

FIG. 9 shows a modification of the output voltage deriving means shown in FIGS. 8A and 8B. In this case, the lower insulating member 53 also made of Teflon takes the form of a funnel having tapered or inclined upper and lower surfaces 73 and 72. Consequently, when the terminal is pressed downwardly as the result of calking, the Teflon insulating member 53 undergoes deformation at contact points, thereby improving the sealing effect.

Figure 10:
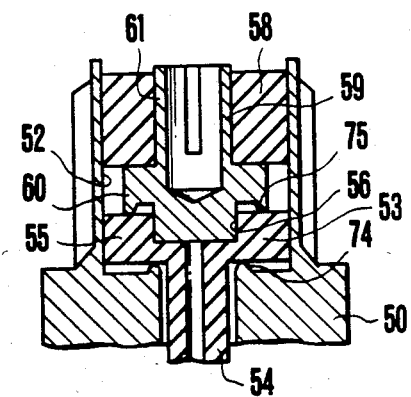

In another modification shown in FIG. 10, the bushing 50 has an annular projection 74 through which it engages the bottom surface of the head 55 of lower insulating member 53, and the bottom surface of the flange 60 of the terminal 59 is provided with an annular projection 75 through which the terminal 59 engages the head 55 of the lower insulating member 53.

Figure 11:
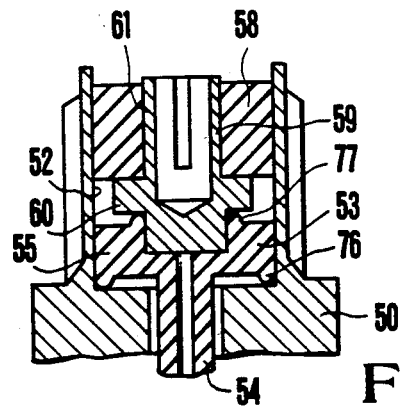

In still another modification shown in FIG. 11, the top and bottom surfaces of the head 55 of the lower insulating member 53 are provided with inner and outer annular projections 77 and 76, respectively.

It should be understood that any other similar constructions can be used for providing a number of contact points adapted to deform the Teflon or like insulator.

What is claimed is:
1. In a piezoelectric pressure indicator comprising a casing, a pressure receiving member at a bottom of said casing, piezoelectric element means mounted on said pressure receiving member for producing an electric voltage corresponding to a pressure applied to said pressure receiving member, an acceleration compensating weight and acceleration compensating piezoelectric element means, said first mentioned piezoelectric ele- ment means and said acceleration compensating piezoelectric element means being electrically connected such that voltages produced by said piezoelectric element means cancel with each other, thereby compensating for an effect of acceleration, the improvement wherein said acceleration compensating piezoelectric element means comprises an uppermost perforated element and an imperforate element thereunder, a lead wire for deriving the electric voltage connected to an electrode of said imperforate element to extend through a perforation of said perforated element, an output voltage deriving means having a bushing inserted into an upper end of said casing, and a terminal connected to said lead wire through a central opening of said bushing, said bushing having at its bottom surface a plurality of radial grooves in communication with the central opening.

2. In a piezoelectric pressure indicator comprising a casing, a pressure receiving member at a bottom of said casing, piezoelectric element means mounted on said pressure receiving member for producing an electric voltage corresponding to a pressure applied to said pressure receiving member, an acceleration compensating weight and acceleration compensating piezoelectric element means, said first mentioned piezoelectric element means and said acceleration compensating piezoelectric element means being electrically connected such that voltages produced by said piezoelectric element means cancel with each other, thereby compensating for an effect of acceleration, the improvement wherein said acceleration compensating piezoelectric element means comprises an uppermost perforated element and an imperforate element thereunder, a lead wire for deriving the electric voltage connected to an electrode of said imperforate element to extend through a perforation of said perforated element, output voltage deriving means having a bushing inserted into an upper end of said casing, said bushing having a cavity and a central opening, said bushing further including a plurality of radial grooves formed at its bottom surface in communication with said central opening, and a terminal inserted in said cavity and connected to said lead wire through a central opening of said bushing.

3. In a piezoelectric pressure indicator comprising a casing, a pressure receiving member at a bottom of said casing, piezoelectric element means mounted on said pressure receiving member for producing an electric voltage corresponding to a pressure applied to said pressure receiving member, an acceleration compensating weight and acceleration compensating piezoelectric element means, said first mentioned piezoelectric element means and said acceleration compensating piezoelectric element means being electrically connected such that voltages produced by said piezoelectric element means cancel with each other, thereby compensating for an effect of acceleration, the improvement wherein said acceleration compensating piezoelectric element means comprises an uppermost perforated element and an imperforate element thereunder, a lead wire for deriving the electric voltage connected to an electrode of said imperforate element to extend through a perforation of said perforated element, an output voltage deriving means having a bushing inserted into an upper end of said casing, said bushing having a cavity, a terminal inserted in said cavity and connected to said lead wire through a central opening of said bushing, said bushing having at its bottom surface a plurality of radial grooves in coomunication with the central opening, upper and lower insulating members made of elastic insulating material and urged against said terminal and said bushing, and means for forming a point contact between said terminal and said lower insulating member.

* * * * *